United States Patent
Chiang et al.

(10) Patent No.: US 7,426,132 B2
(45) Date of Patent: Sep. 16, 2008

(54) STATIC RANDOM ACCESS MEMORY DEVICE HAVING A HIGH-BANDWIDTH AND OCCUPYING A SMALL AREA

(75) Inventors: Cheng-Lung Chiang, Tainan (TW); Ming-Cheng Chiu, Tainan (TW)

(73) Assignee: Himax Technologies, Inc. (TW)

( * ) Notice: Subject to any disclaimer, the term of this patent is extended or adjusted under 35 U.S.C. 154(b) by 0 days.

(21) Appl. No.: 11/374,448

(22) Filed: Mar. 13, 2006

(65) Prior Publication Data

US 2007/0211518 A1    Sep. 13, 2007

(51) Int. Cl.
*G11C 7/00*    (2006.01)
(52) U.S. Cl. ............. 365/154; 365/189.05; 365/189.06; 365/205
(58) Field of Classification Search ................. 365/205, 365/189.01, 154
See application file for complete search history.

(56) References Cited

U.S. PATENT DOCUMENTS

| 5,627,789 | A  | * | 5/1997 | Kalb, Jr. | .................... 365/205 |
| 2005/0289319 | A1 | * | 12/2005 | Kang | ........................ 711/200 |

* cited by examiner

*Primary Examiner*—Hoai V. Ho
*Assistant Examiner*—Jason Lappas
(74) *Attorney, Agent, or Firm*—Baker & McKenzie LLP

(57) ABSTRACT

An SRAM device is disclosed, which comprises a plurality of rows of SRAM cells and a line-buffer SRAM cell. Each row of SRAM cells is controlled by a word line. The line-buffer SRAM cell is coupled to the rows of SRAM cells and controlled by a read enable line. The signal on the read enable line is activated after the signal on the word line is activated, and part of the activated signal on the read enable line overlaps with the activated signal on the word line. The power provided to the line-buffer SRAM cell is selectively cut off.

10 Claims, 6 Drawing Sheets

STATIC RANDOM ACCESS MEMORY DEVICE HAVING A HIGH-BANDWIDTH AND OCCUPYING A SMALL AREA

BACKGROUND OF THE INVENTION

1. Field of the Invention

The present invention relates, in general, to SRAM (Static Random Access Memory) devices, and, in particular, certain embodiments of the invention relate to small-sized, high-bandwidth SRAM devices.

2. Description of the Related Art

Cell phones typically have displays, which are generally formed of an LCD or an OLED panel. The image signal of each pixel of the panel is stored in a SRAM device. The SRAM device is a type of memory which doesn't need periodic refresh signals like in a DRAM (Dynamic Random Access Memory) device to hold the stored data. Generally, the SRAM device is composed of an array of SRAM cells.

Referring to FIG. 1, a schematic circuit diagram of a traditional SRAM cell is shown. Unlike a DRAM device which stores data in a capacitor, data held in a SRAM cell are stored in a pair of cross-coupled inverters which consist of NMOS (N-Channel Metal Oxide Semiconductor) transistors 11, 12 and PMOS (P-Channel Metal Oxide Semiconductor) transistors 13, 14, known as a Flip-Flop. For a six-transistor SRAM cell, the drain electrode of NMOS transistor 11 is connected to the drain electrode of PMOS transistor 13 and the drain electrode of NMOS transistor 12 is connected to the drain electrode of PMOS transistor 14. The gate electrode of NMOS transistor 11 is connected to the gate electrode of PMOS transistor 13 and the drain electrode of NMOS transistor 12. The gate electrode of NMOS transistor 12 is connected to the gate electrode of PMOS transistor 14 and the drain electrode of NMOS transistor 11. In addition, the drain electrode of the NMOS transistor 11 is also connected to the source electrode of a first access transistor 15, and the drain of the NMOS transistor 12 is connected to the source electrode of a second access transistor 16. Furthermore, the drain electrode of the first access transistor 15 is connected to one of the bit lines 20, and the drain electrode of the second access transistor 16 is connected to one of the n-bit lines 22. Moreover, the gate electrodes of the first access transistor 15 and the second access transistor 16 are connected to one of the word lines 24. The source electrodes of PMOS transistor 13 and PMOS transistor 14 are further connected to the power source $V_{DD}$, and the source electrodes of the NMOS transistor 11 and NMOS transistor 12 are grounded.

Referring now to FIG. 2, a schematic electric diagram of a traditional SRAM cell array is shown. The SRAM cell array shown in FIG. 2 is an (M+1)×(N+1) array, having (M+1) rows and (N+1) columns of SRAM cells. The SRAM cells on the zeroth row of the SRAM cells array (the lowest one in FIG. 2) are connected to the zeroth word line (the lowest one in FIG. 2, shown as "WL0"). The SRAM cells on the first row of the array are connected to the first word line, shown as "WL1" in FIG. 2, and those on the M-th row of the array (the highest one in FIG. 2) are connected to the M-th word line, shown as "WLM". On the other hand, the SRAM cells on the zeroth column of the SRAM cells array (the leftmost one in FIG. 2) are connected to the zeroth bit line and zeroth n-bit line (the leftmost one in FIG. 2, shown as "BL0" and "n-BL0"). The SRAM cells on the N-th column of the SRAM cells array (the rightmost one in FIG. 2) are connected to the N-th bit line and N-th n-bit line (the rightmost one in FIG. 2, shown as "BLN" and "n-BLN").

Each SRAM cell in the array is connected to a specific word line and a specific bit line and n-bit line. Each word line is coupled to a X-decoder which will be illustrated in FIG. 3 below. Similarly, each bit line and each n-bit line will be coupled to a specific Y-decoder, as shown in FIG. 3 below.

Referring now to FIG. 3, a schematic diagram of a traditional SRAM device is shown. The SRAM device includes a SRAM cell array 30, which is connected to one X-decoder 32, a first Y-decoder 34, and a second Y-decoder 36. The X-decoder 32 is a word line decoder, which is used to access the desired address word line. The first Y-decoder 34 and the second Y-decoder 36 are utilized to access the desired address bit line. Matching a specific word line and a specific bit line can enable a specific SRAM cell in the array. Both the X-decoder 32 and the first Y-decoder 34 are driven by a microcontroller 37, such as a CPU or an ASIC.

The first Y-decoder 34 is connected to a first sense amplifier 38, and the second Y-decoder 36 is connected to a second sense amplifier 39. The first sense amplifier 38 and the second sense amplifier 39 are used to retrieve data from the SRAM cell array, by receiving differential complimentary signals on the bit lines and the n-bit lines and reading the data (logic high "1" or logic low "0") stored in each specific SRAM cell. Further, the second sense amplifier 39 is further connected to a line buffer 41 and then coupled to a LCD source or other target.

To prolong the work and standby duration of the cell phone, it is desirable to use a low power consumption SOC driver. However, the SRAM device used to store the image signal of each pixel consumes a large amount of power. For this reason, it is desirable to reduce the power consumption for a portable SOC driver both in the operational and standby stages. The lower the power consumption of the SRAM device, the longer the operational and standby durations can be.

Furthermore, the required physical size of the SRAM device is another important issue. By reducing the physical size of the SRAM device, lower manufacturing costs of the SRAM device may be obtained.

Accordingly, there is a need for an improved design for SRAM devices, to achieve reduced physical size SRAM devices and increase the work or standby duration.

SUMMARY OF THE INVENTION

Certain embodiments of the present invention provide a small sized, high bandwidth SRAM device.

An SRAM device is disclosed in certain embodiments of the present invention. The SRAM device may comprise a plurality of rows of SRAM cells and a line-buffer SRAM cell. Each row of the SRAM cells is connected to a word line. The line-buffer SRAM cell is coupled to the rows of the SRAM cells and connected to a read enable line. The signal on the read enable line is activated after the signal on the word line is activated, and part of a duration of the activated signal on the read enable line overlaps with part of a duration of the activated signal on the word line. The power provided to the line-buffer SRAM cell is selectively cut off.

An SRAM device is disclosed in certain embodiments of the present invention. The SRAM device may comprise a SRAM cell array, a X-decoder, a Y-decoder, and a Y-component. The SRAM cell array includes at least one row of SRAM cells and at least one column of SRAM cells. The X-decoder is connected to the SRAM cell array, and the Y-decoder is also connected to the SRAM cell array. The Y-component is connected to the SRAM cell array, and includes a row of SRAM cells.

The Y-component may include the function of a Y-decoder, a line buffer or a sense amplifier. The Y-component can also include the functions of combining a Y-decoder and a line buffer. The Y-component can also include the functions of combining a Y-decoder and a sense amplifier. The Y-component can also include the functions of combining a line buffer and a sense amplifier. The Y-component can also include the functions of combining a Y-decoder, a line buffer and a sense amplifier.

In certain embodiments of the present invention, an SRAM cell array includes at least one column of SRAM cells and at least two rows of SRAM cells; wherein one row of SRAM cells of the at least two rows SRAM cells serves as a line buffer and a sense amplifier.

In certain embodiments of the present invention, an SRAM cell array includes at least one column of SRAM cells and at least two rows of SRAM cells; wherein one row of SRAM cells of the at least two rows SRAM cells serves as a Y-decoder and a sense amplifier.

In certain embodiments of the present invention, an SRAM cell array includes at least one column of SRAM cells and at least two rows of SRAM cells; wherein one row of SRAM cells of the at least two rows SRAM cells serves as a line buffer and a Y-decoder.

In certain embodiments of the present invention, an SRAM cell array includes at least one column of SRAM cells and at least two rows of SRAM cells; wherein one row of SRAM cells of the at least two rows SRAM cells serves as a Y-decoder, a line buffer and a sense amplifier.

Certain embodiments of the present invention can be used for drivers of OLEDs, STN LCDs, CSTN LCDs, and TFT LCDs.

DETAILED DESCRIPTION OF PREFERRED EMBODIMENTS

Figure 1:
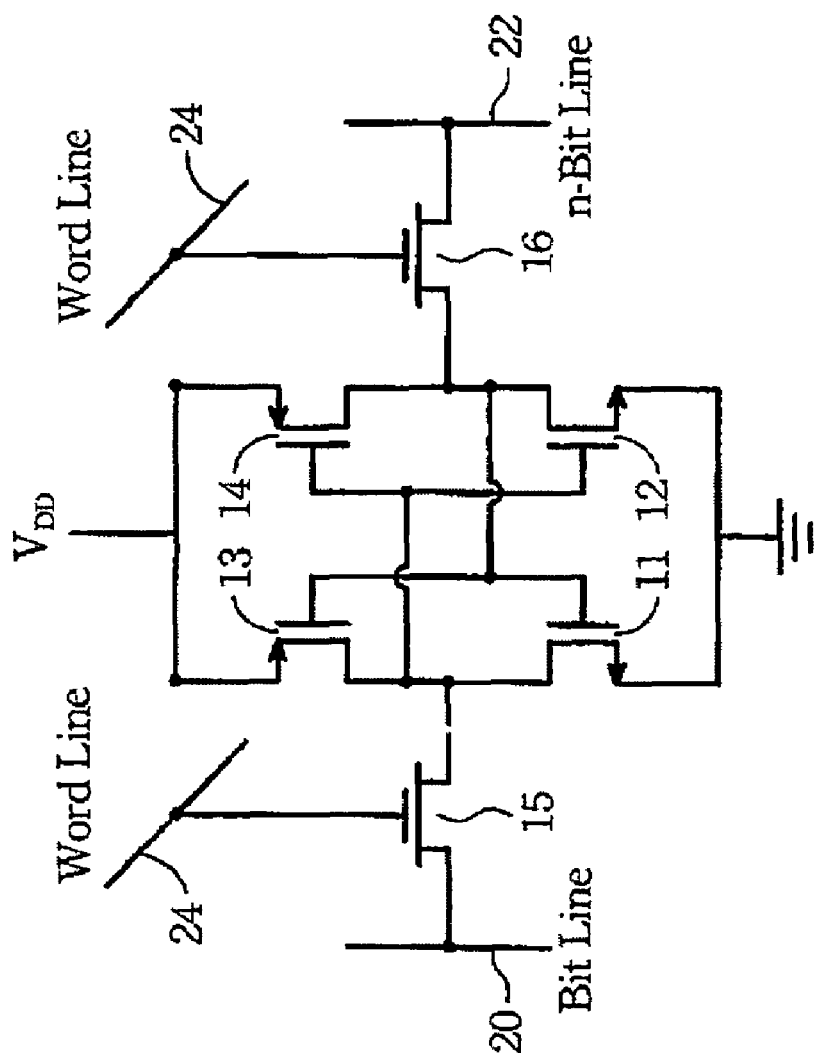
FIG. 1 is a schematic circuit diagram of a traditional SRAM cell according to the prior art.
Figure 2:
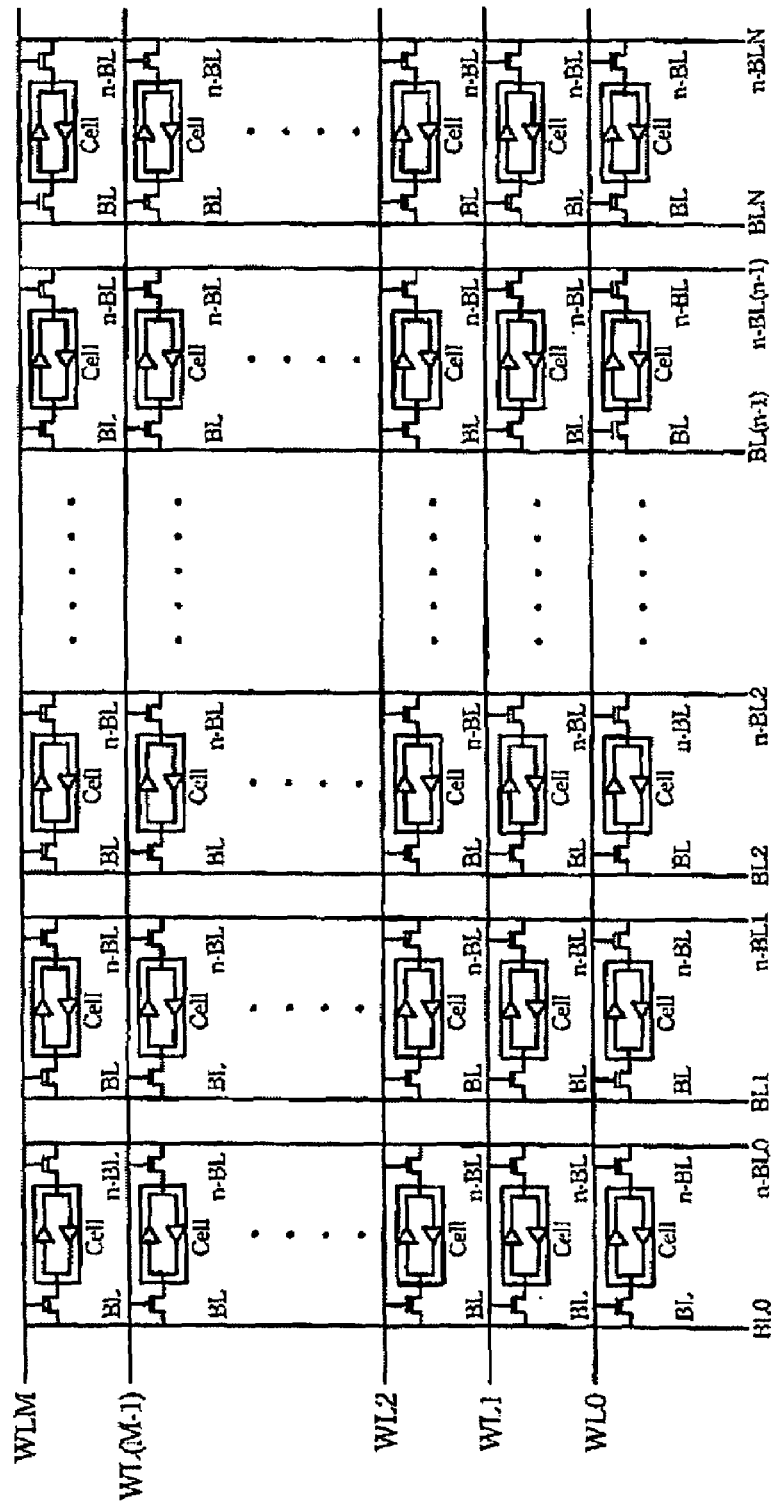
FIG. 2 is a schematic electric diagram of a traditional SRAM cell array according the prior art.
Figure 3:
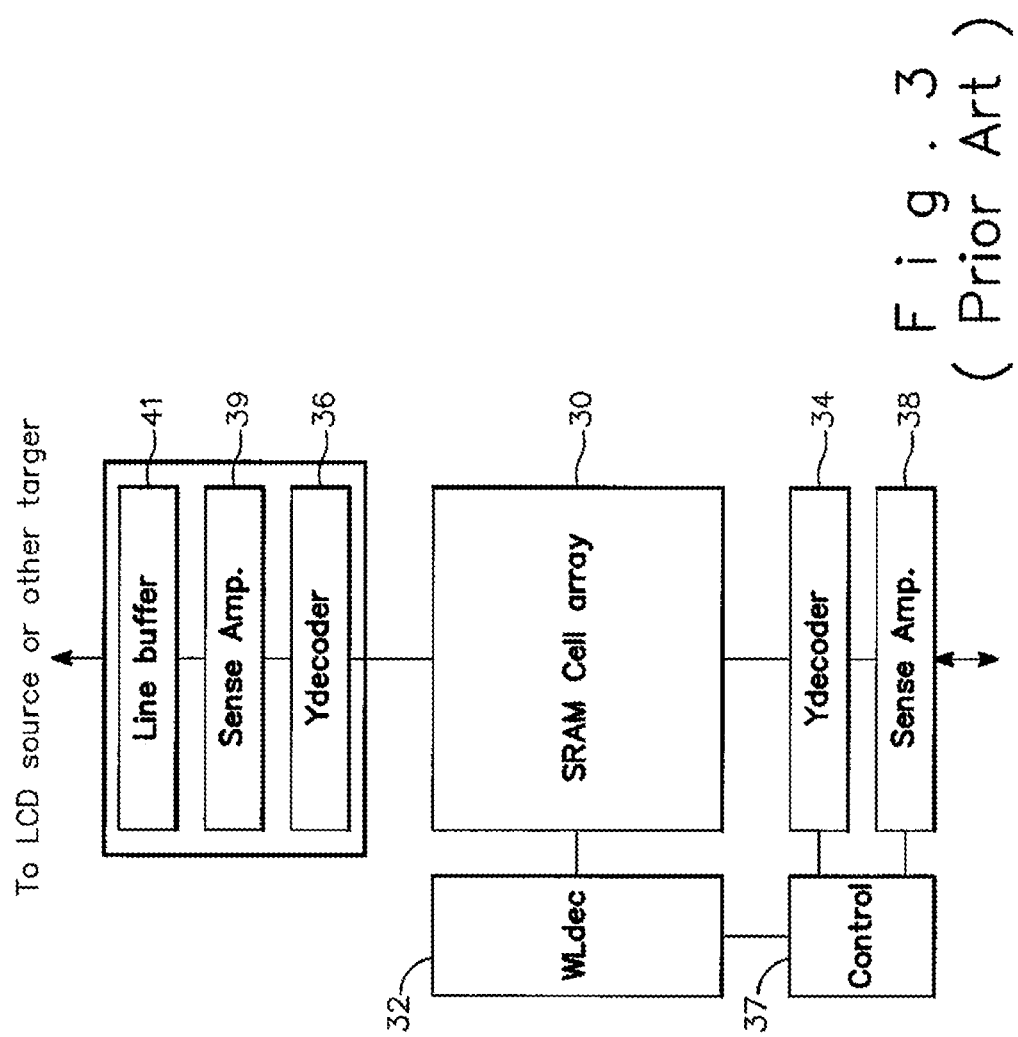
FIG. 3 is a schematic diagram of a traditional SRAM device according to the prior art.
Figure 4:
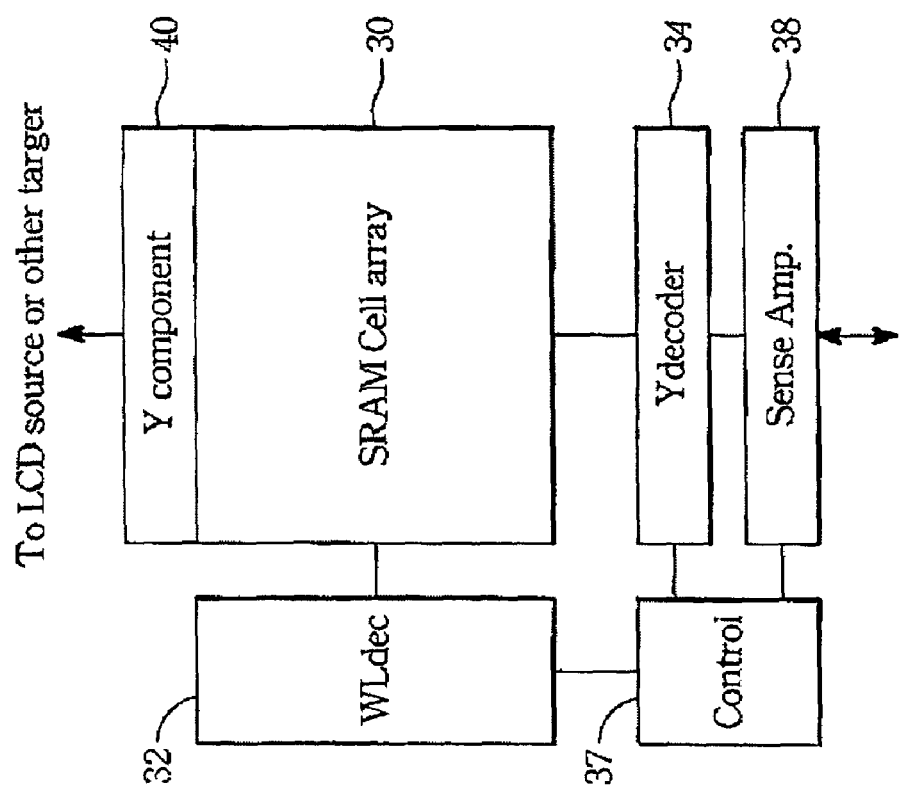
FIG. 4 is a schematic diagram of an SRAM device in accordance with one embodiment of the present invention.

Referring to FIG. 4, a schematic diagram of an SRAM device in accordance with one embodiment of the present invention is shown. The SRAM device includes an SRAM cell array 30, which is connected to an X-decoder 32, a first Y-decoder 34, and a Y-component 40.

The SRAM cell array 30 is made of an array of SRAM cells. The data held in each SRAM cell are stored in a pair of cross-coupled inverters, known as a flip-flop. The drain electrode of the first inverter and the second inverter are connected to a first load and a second load, respectively. For a six-transistor SRAM cell, the first load and the second load are transistors, generally thin-film transistors. For a four-transistor SRAM cell, the first load and the second load are replaced by two passive poly resistors with low conductivity. In addition, the drain electrode of the first inverter is also connected to the source electrode of a first access transistor, and the drain electrode of the second inverter is connected to the source electrode of a second access transistor. Furthermore, the drain electrode of the first access transistor is coupled to one of the bit lines, and the drain electrode of the second access transistor is coupled to one of the n-bit lines. Moreover, the gate electrodes of the first access transistor and the second access transistor are connected to one of the word lines. Furthermore, the first load and the second load are further coupled to the voltage source VDD, and the source electrodes of the first inverter and second inverters are grounded.

The X-decoder 32 is a word line decoder, which is used to access a desired address word line. The first Y-decoder 34 is utilized to access a desired address bit line. Matching a specific word line and a specific bit line can enable a specific SRAM cell in the array. Both the X-decoder 32 and the first Y-decoder 34 are driven by a micro-controller 37, such as a CPU or an ASIC.

The first Y-decoder 34 is connected to a first sense amplifier 38, which is used to retrieve data from the SRAM cell array by receiving the differential complimentary signals on the bit lines and the n-bit lines and reading the data (logic high "1" or logic low "0") stored in each specific SRAM cell. The Y-component 40 serves as a sense amplifier and a line buffer, and may be coupled directly to a LCD source or other target.

Figure 5:
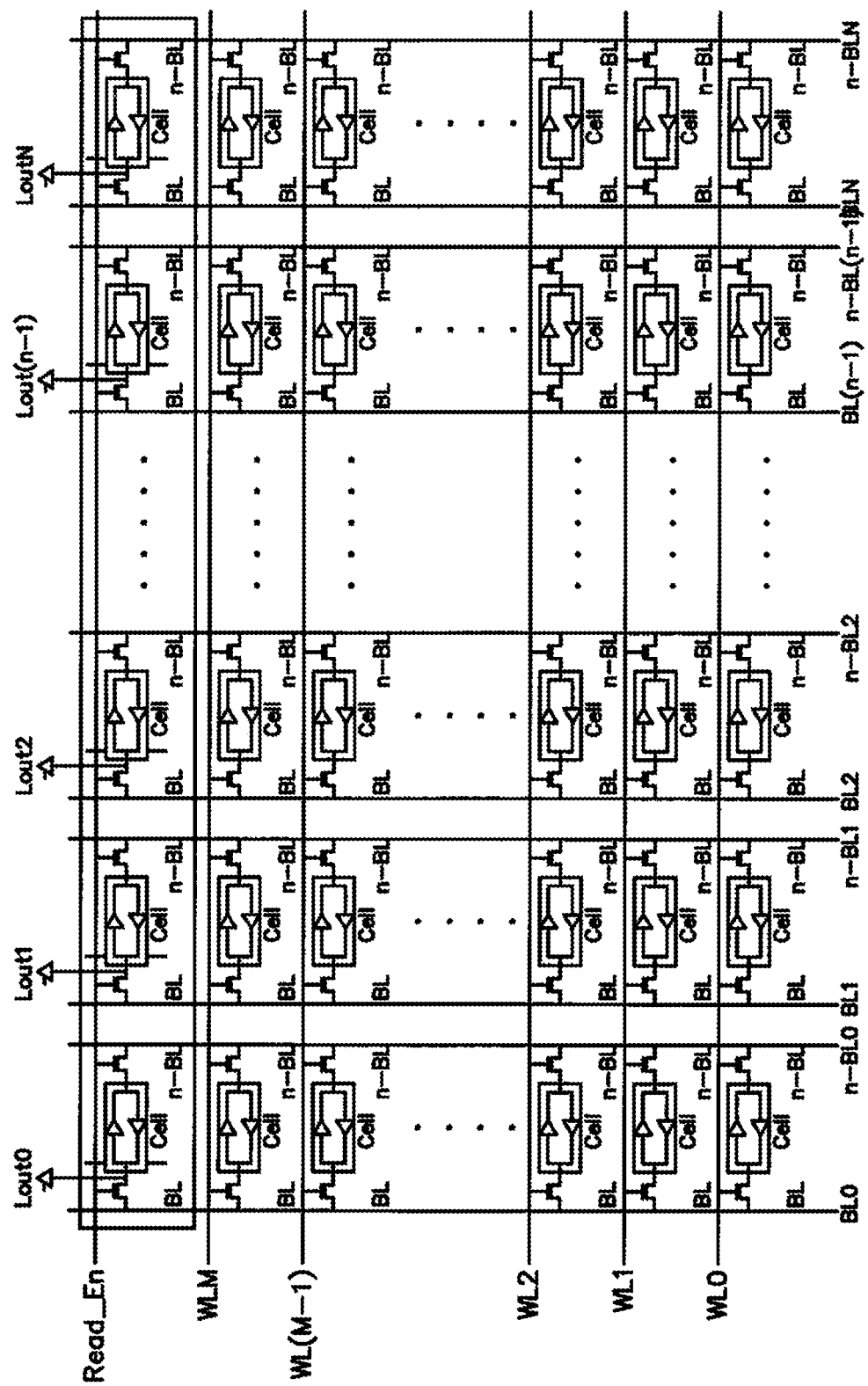
FIG. 5 is a schematic circuit diagram of the SRAM cell array and the Y-component in accordance with one embodiment of the present invention

Referring now to FIG. 5, a schematic circuit diagram of the SRAM cell array 30 and the Y-component 40 disclosed in accordance with one embodiment of the present invention is shown. The SRAM cell array shown in FIG. 5 is an (M+1)×(N+1) array, having (M+1) rows and (N+1) columns of SRAM cells. The SRAM cells on the zeroth row of the SRAM cells array 30 (the lowest one in FIG. 5) are connected to the zeroth word line (the lowest one in FIG. 5, shown as "WL0"). The SRAM cells on the first row of the array are connected to the first word line, shown as "WL1" in FIG. 5, and those on the M-th row of the array (the second highest one in FIG. 5) are connected to the M-th word line, shown as "WLM". On the other hand, the SRAM cells on the zeroth column of the SRAM cells array (the leftmost one in FIG. 5) are connected to the zeroth bit line and zeroth n-bit line (the leftmost one in FIG. 5, shown as "BL0" and "n-BL0"). The SRAM cells on the N-th column of the SRAM cells array (the rightmost one in FIG. 5) are connected to the N-th bit line and N-th n-bit line (the rightmost one in FIG. 5, shown as "BLN" and "n-BLN").

According to one embodiment of the present invention, the Y-component 40 is a duplication of one whole row of SRAM cells from the original SRAM cell array shown in FIG. 5. Each gate electrode of the access transistors of the SRAM cells of the Y-component is connected to the read-enable line, which is shown as "Read-En" in FIG. 5. The data stored in the Y-component 40 can be controlled by the read-enable line, so it would not be influenced by the SRAM cell array while the SRAM device is operating. Furthermore, the power line and the ground line of the Y-component 40 should be independent to those of the SRAM cell array. The power provided to the Y-component 40 may be selectively cut off.

Since the Y-component 40 is just made of a row of SRAM cells from the original SRAM cell array and has the functions of the sense amplifier, and the line buffer in the prior art, the size requirement of the Y-component 40 in the present invention is largely reduced.

Figure 6:
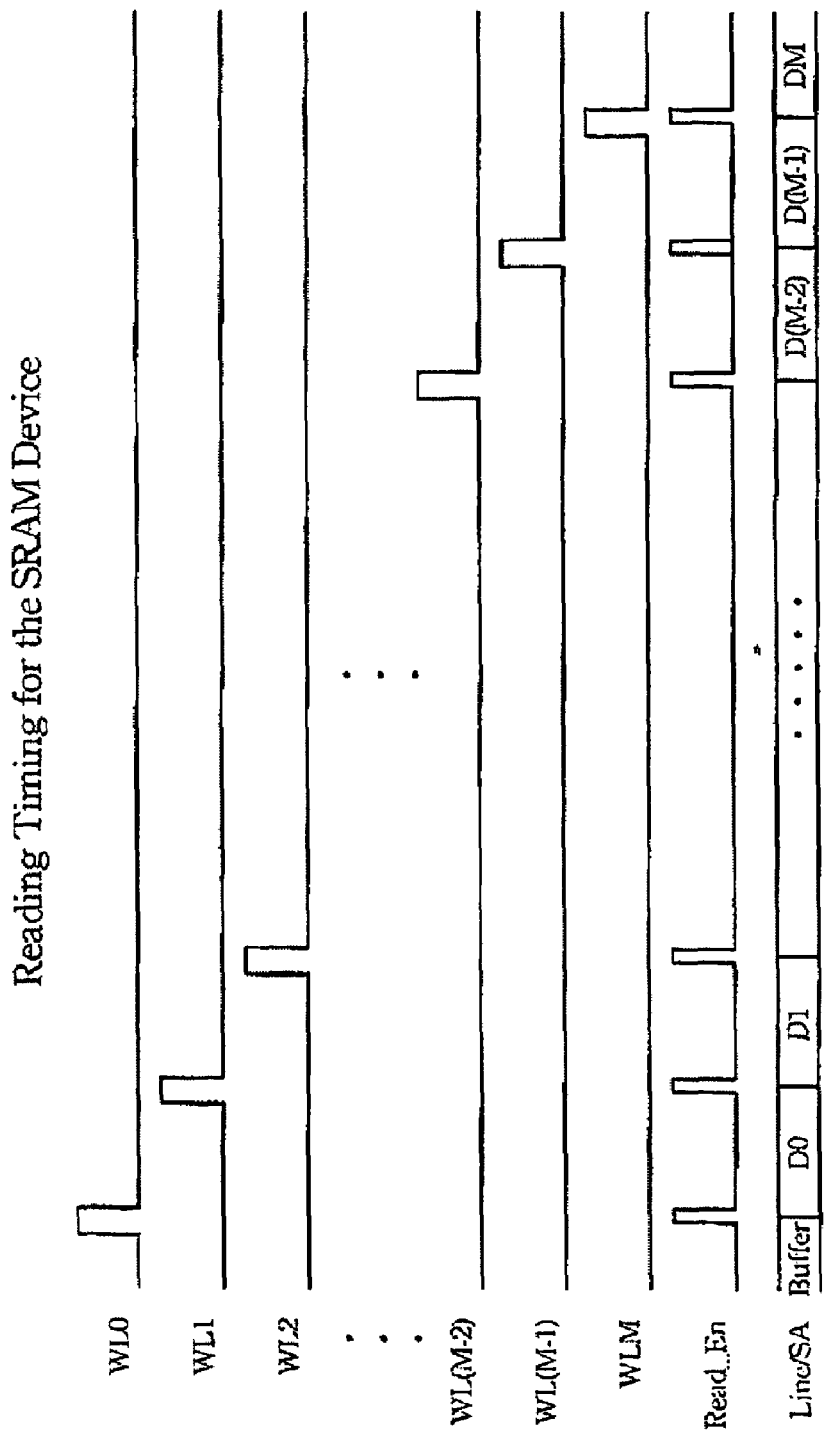
FIG. 6 is a schematic timing diagram for reading the SRAM device in accordance with one embodiment of the present invention.

Referring now to FIG. 6, a schematic timing diagram for reading the SRAM device disclosed in accordance with one embodiment of the present invention is shown.

According to certain embodiments of the present invention, whenever one word line is initiated, all the data stored at the SRAM cells of the word line can be read into the Y-component 40, which is controlled by the read-enable line. In other word, the data stored at one or more than two rows of SRAM cells can be read into the Y-component 40 in one single scan step. Compared to the prior art, which needs to scan one SRAM cell after another, the Y-component 40 of certain embodiments of the present invention can significantly reduce power consumption.

In accordance with certain embodiments of present invention, an SRAM device comprises a plurality rows of SRAM cells and a line-buffer SRAM cell. Each row of the SRAM cells is connected to a word line and controlled by a signal on the word line. The line-buffer SRAM cell is coupled to the rows of SRAM cells, connected to a read enable line and controlled by a signal on the read enable line. The signal on the read enable line is activated after the signal on the word line is activated and at least part of the signal durations of the signals on the read enable line and the word line overlap. The power provided to the line-buffer SRAM cell may be selectively cut off.

In summary, the Y-component design disclosed in accordance with one embodiment of the present invention can reduce the whole chip size of the SRAM device and minimize the power consumption of the SRAM device.

It will be apparent to those skilled in the art that various modifications and variations can be made in the disclosed embodiments without departing from the scope or spirit of the present invention. Other embodiments of the invention will be apparent to those skilled in the art from consideration of the specification and practice of the invention disclosed herein. It is intended that the specification and examples provided herein be considered as exemplary only, with a true scope of the invention being indicated by the following claims and their equivalents.

We claim:

1. An SRAM device having two outputs respectively coupled to two different apparatuses outside the SRAM device, comprising:
   a plurality of rows of SRAM cells, each row being connected to one of a plurality of word lines and a plurality of bit lines;
   a decoder coupled between said plurality of rows of SRAM cells and one of the two outputs, and connected to the bit lines for accessing one of the bit lines; and
   a row of line-buffer SRAM cells, coupled between said plurality of rows of SRAM cells and the other one of the two outputs, being connected to a read enable line and the bit lines, wherein said row of line-buffer SRAM cells is configured to allow data stored within one of said plurality of rows of SRAM cells to be duplicated to said row of line-buffer SRAM cells, wherein the plurality of rows of SRAM cells and the row of line-buffer SRAM cells form a SRAM cell array;
   wherein a signal on said read enable line is activated after a signal on said one of the plurality of word lines is activated, and p art of a duration of the activated signal on said read enable line overlaps with part of a duration of the activated signal on said one of the plurality of word lines.

2. The SRAM device of claim 1, wherein power provided to said row of line-buffer SRAM cells is selectively cut off.

3. An SRAM device having two outputs respectively coupled to two apparatuses outside the SRAM device, comprising:
   an SRAM cell array comprising at least one row of SRAM cells and at least one column of SRAM cells;
   a X-decoder, wherein said X-decoder is connected to said SRAM cell array;
   a Y-decoder, wherein said Y-decoder is connected between said SRAM cell array and one of the two outputs; and
   a row of SRAM cells in said SRAM cell array, coupled between said SRAM cell array and the other one of the two outputs, and connected to a read enable line, said row of SRAM cells configured to store data duplicated from a row of SRAM cells in the SRAM cell array.

4. The SRAM device of claim 3, further comprising a sense amplifier which is connected to said Y-decoder.

5. The SRAM device of claim 4, wherein said sense amplifier is connected to a micro-controller.

6. The SRAM device of claim 3, wherein said row of SRAM cells functions as a line-buffer.

7. The SRAM device of claim 3, wherein the SRAM device further comprises a plurality of word lines coupled to the SRAM cell array, and a signal on said read enable line is activated after a signal on one of the word lines is activated, and part of a duration of the activated signal on said read enable line overlaps with part of a duration of the activated signal on said one of the word lines.

8. The SRAM device of claim 3, wherein the other one of the two outputs is coupled to a LCD source.

9. The SRAM device of claim 3, wherein the Y-decoder is coupled between one side of said plurality of rows of SRAM cells and one of the two outputs, and the row of SRAM cells is coupled between the other side of said plurality of rows of SRAM cells and the other one of the two outputs.

10. The SRAM device of claim 1, wherein the decoder is coupled between one side of said plurality of rows of SRAM cells and one of the two outputs, and the row of line-buffer SRAM cells is coupled between the other side of said plurality of rows of SRAM cells and the other one of the two outputs.

* * * * *